(12) United States Patent
Dellow (10) Patent No.: US 6,630,849 B2
(45) Date of Patent: Oct. 7, 2003

(54) DIGITAL FREQUENCY DIVIDER WITH A SINGLE SHIFT REGISTER

(75) Inventor: Andrew Dellow, Bristol (GB)

(73) Assignee: STMicroelectronics Limited, Bristol (GB)

( * ) Notice: Subject to any disclaimer, the term of this patent is extended or adjusted under 35 U.S.C. 154(b) by 0 days.

(21) Appl. No.: 10/099,588

(22) Filed: Mar. 13, 2002

(65) Prior Publication Data

US 2003/0020522 A1 Jan. 30, 2003

(30) Foreign Application Priority Data

Mar. 13, 2001 (EP) .............................. 01302299

(51) Int. Cl.[7] .............................................. H03K 21/00
(52) U.S. Cl. .......................................... 327/115; 377/47
(58) Field of Search .................................. 327/115, 117, 327/118; 377/47, 48

(56) References Cited

U.S. PATENT DOCUMENTS 3,890,581 A * 6/1975 Stuart et al. ................. 332/101
4,234,849 A * 11/1980 Crilly, Jr. ..................... 377/110
4,315,166 A * 2/1982 Hughes ......................... 377/33
5,510,742 A 4/1996 Lemaire ....................... 327/146
6,393,089 B1 * 5/2002 Maba et al. ................... 377/47

* cited by examiner

Primary Examiner—Timothy P. Callahan
Assistant Examiner—Lina Nguyen
(74) Attorney, Agent, or Firm—Lisa K. Jorgenson; Robert Iannucci; Seed IP Law Group, PLLC

(57) ABSTRACT

A digital frequency divider has a single circulating shifter register loaded with a bit sequence of variable length and having two outputs adjacent such that are output is equal to the other delayed by one clock period. The outputs are passed to a multiplexer via further logic, the multiplexer selecting one of two inputs depending on whether a clock is high or low. Program logic is provided so that the circuit is configurable for odd, even or half integer division by detecting changes in the bit sequence between 0 and 1 and selectively "deleting" the first half clock cycle when a change is detected. This allows even, odd or half integer clock division with an "even" mark space ratio.

15 Claims, 6 Drawing Sheets

| NODE | INPUT = 0 | INPUT = 1 | INPUT = 0 | INPUT = 1 |
|---|---|---|---|---|
| A | 0 | 0 | 1 | 1 |
| B | 0 | 1 | 0 | 1 |
| C | 0 | 0 | 1 | 1 |
| D | 0 | 1 | 0 | 1 |
| E | 0 | 1 | 0 | 0 |
| F | 0 | 0 | 1 | 0 |
| G | 0 | 1 | 1 | 0 |
| H | 0 | 0 | 1 | 1 |
| HNEXT | 0 | 1 | 1 | 0 |

TABLE 2

*Fig. 9*

DIGITAL FREQUENCY DIVIDER WITH A SINGLE SHIFT REGISTER

BACKGROUND OF THE INVENTION

1. Field of the Invention

The present invention relates to a digital frequency divider, and in particular to a frequency divider with a shift register.

2. Description of the Related Art

In digital systems, integrated circuits (ICs) or chips are operated by pulses from a clock. In systems such as television receivers or decrypters, there can be many different chips, or regions within a chip, each operating at a different clock frequency. The different regions operating at different frequencies are referred to as "clock domains". For example, one chip may operate as a master chip in a 166 MHz domain, with another store chip in a 133 MHz domain. In this situation, there is a need for two clock frequencies.

One solution to the problem of providing different clock frequencies is to divide a high speed reference by different amounts.

BRIEF SUMMARY OF THE INVENTION

We have appreciated that the frequency division should introduce a minimum noise into the clocking signal, and involve efficient use of circuitry.

Accordingly, there is provided a digital frequency divider for dividing a clock frequency comprising:

a shift register for storing a bit sequence chosen according to a division factor having one or more tap off points and arranged to provide at least two signals representative of the bit sequence under control of a clock signal at a first frequency;

control logic circuitry having at least two inputs arranged to receive the two signals representative of the bit sequence and arranged to provide at least two output signals; and a multiplexer arranged to receive the two output signals and to select one of the output signals in turn under control of the clock signal at the first frequency to thereby produce a clock output signal at a second frequency being a division of the first frequency;

wherein the control logic circuitry comprises a detector configured to detect a change in the bit sequence between 0 and 1 and the control logic circuitry being arranged to selectively provide a 0 or 1 as one of the output signals when a change in the bit sequence between 0 to 1 is detected depending on whether even, odd or half integer division is performed.

The detection of changes in the bit sequence in the shift register between 0 and 1 provides information in addition to simply knowing whether the sequence is at 0 or 1 and allows the bit sequence to be chosen for odd, even or half integer division using a single shift register in an efficient manner. The use of a single shift register requires a smaller area of circuitry than a two shift register system.

BRIEF DESCRIPTION OF THE SEVERAL VIEWS OF THE DRAWINGS

An embodiment of the invention will now be described, by way of example only, in which.

DETAILED DESCRIPTION OF THE INVENTION

Figure 1:
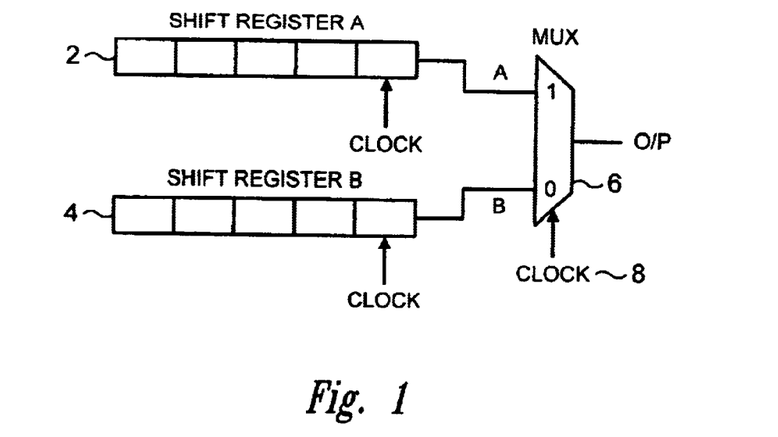
FIG. 1 shows two shift register digital frequency divider.

A two shift register frequency divider is shown in FIG. 1, and comprises two variable length shift registers 2,4 each providing an input to a multiplexer (MUX)6 arranged such that the output (o/p) from the multiplexer is alternately equal to the output from the first shift register (A) then the second shift register (B). The shift registers and the multiplexer are activated by a digital clock signal 8. Although not shown, the shift registers are in fact rotatable so that the output is rotated back to the input whereby the contents of the register is rotated with each bit in turn presented at the output. The shift registers are arranged to progress on a change in the clock from low to high, whereas the multiplexer is simply level sensitive. The multiplexer thus selects Register A when the clock is high and Register B when the clock is low.

Figure 2:
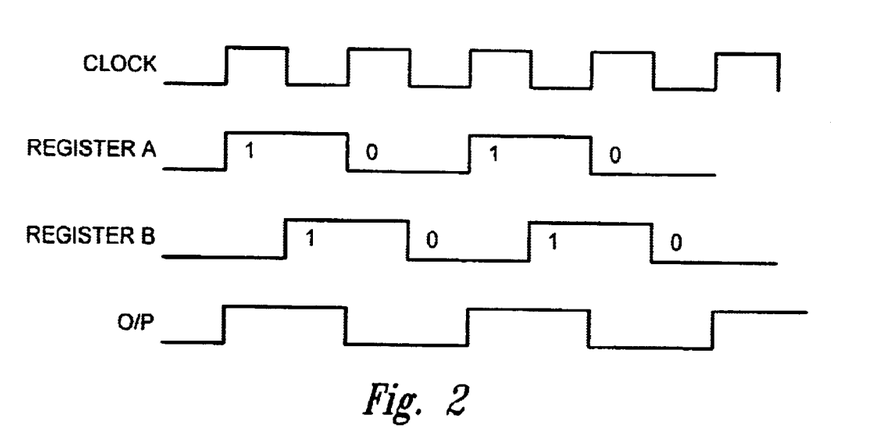
FIG. 2 shows sequences for the two shift register divider for various divisions.

The output signal o/p is a division of the clock signal depending on the length and arrangement of bits in the shift register. The arrangement of bits in the registers for a simple division by two is shown in FIG. 2. As can be seen, the contents of each register is a simple sequence of repeating (10101010 . . . ). In fact, a shift register containing the sequence (1010) may be used and rotated in a continuous loop.

Figure 3:
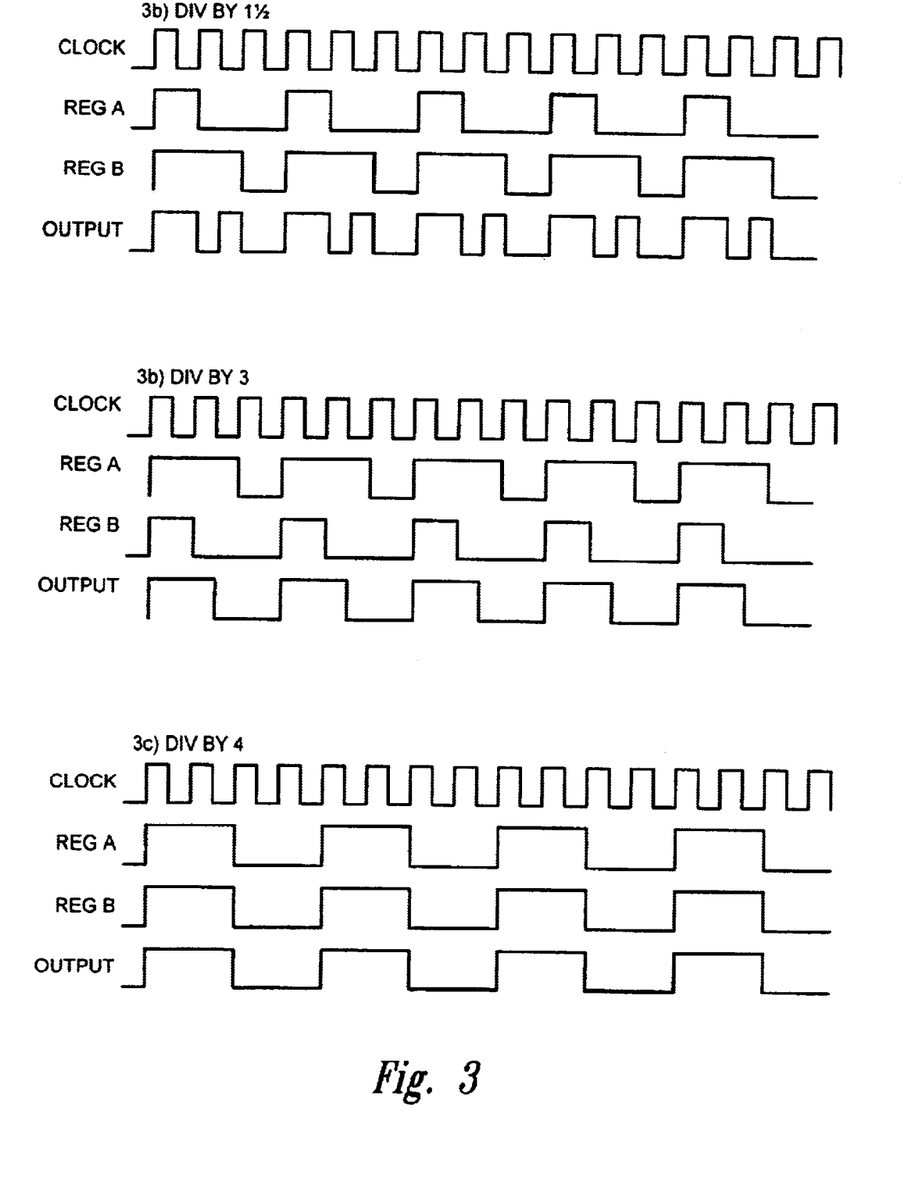
FIG. 3 shows sequences for division by various other factors.

The two shift register divider works for other divisions, as shown in FIG. 3. In FIG. 3(a) division by a factor of 1½, is shown. The smallest units for each register are:

| | | | |
|---|---|---|---|
| Register A | 1 | 0 | 0 |
| Register B | 1 | 1 | 0 |

Similarly FIG. 3(b) shows division 3 with the following registers:

| | | | |
|---|---|---|---|
| Register A | 1 | 1 | 0 |
| Register B | 1 | 0 | 0 |

Lastly, FIG. 3(c) shows division by 4 with registers as follows:

| | | | | |
|---|---|---|---|---|
| Register A | 1 | 1 | 0 | 0 |
| Register B | 1 | 1 | 0 | 0 |

It will be noted that the ratio between highs and lows (the mark-space ratio) for division by half integer numbers is uneven, but over two or more cycles produces a high state and low state for equal durations. For even or odd integer division the mark-space ratio is even. To allow for differing high/low sequences for different divisions, the shift registers are variable length. As can be seen the higher the division factor, the longer the shift register needs to be.

Figure 4:
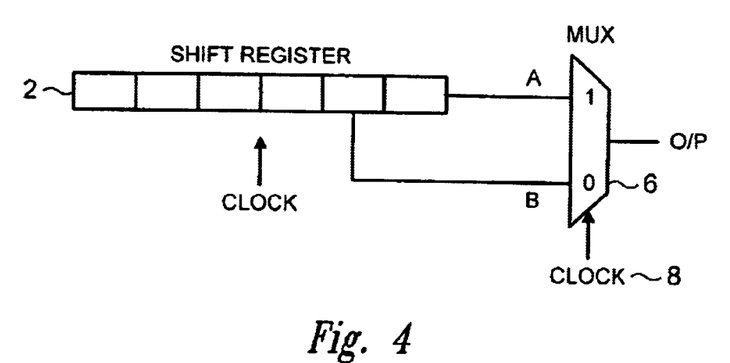
FIG. 4 shows a single shift register digital frequency divider.
Figure 5:
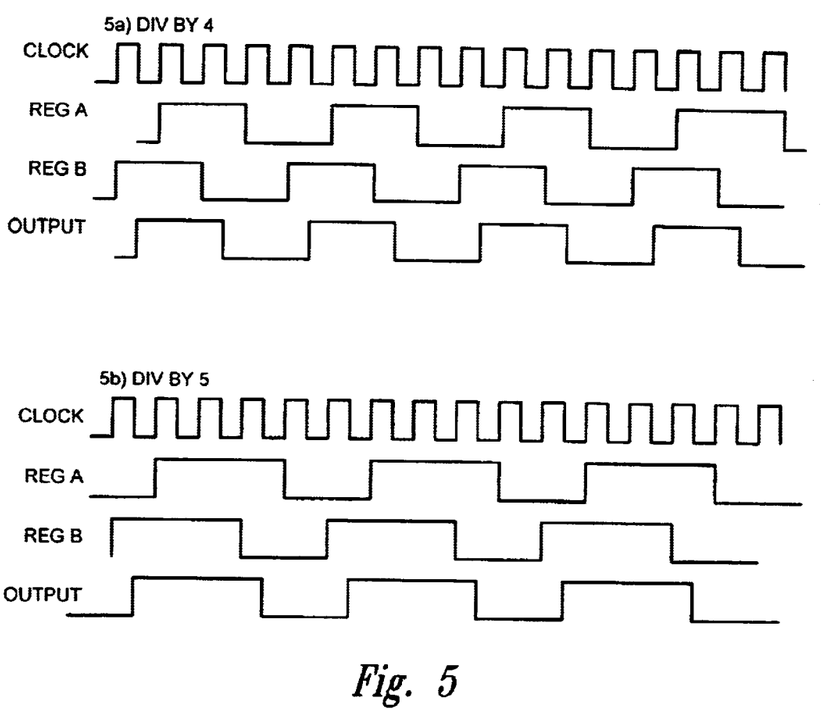
FIG. 5 shows various register sequences for the single shift register frequency divider of FIG. 4.

An arrangement with a single shift register is shown in FIG. 4. As before, a multiplexer 6 selects either input A or B alternately under control of a clock 8. A single shifter register 2 now provides the input to both the A and B inputs of the MUX 6, with the A input being tapped from the shift register at a point one register from the end so that input A is an historical version in input B. This arrangement can also be used to divide by integer divisions. As shown in FIG. 5, inter divisions are achieved with the register loaded as follows.

For division by 4, as shown in FIG. 5(a) the shift register stores:

| Register | 1 | 1 | 0 | 0 |
|---|---|---|---|---|

For division by 5, as shown in FIG. 5(b) the shift register stores:

| Register | 1 | 1 | 1 | 0 | 0 |
|---|---|---|---|---|---|

However, for division by 5, the mark-space ratio is now uneven with a ratio of 5:4. Moreover, over many cycles, the high state is present more than the low state. Such an uneven mark-space ratio could cause noise and power problems, and so is not preferred.

A single shift register as shown in FIG. 4 cannot divide by a half integer factor. This is because division by a half integer requires the inputs on A and B to have a different sequence, whereas a single shift register in the arrangement shown can only ever produce the same sequence on A as on B, because each bit is presented first on B then on A.

Figure 6:
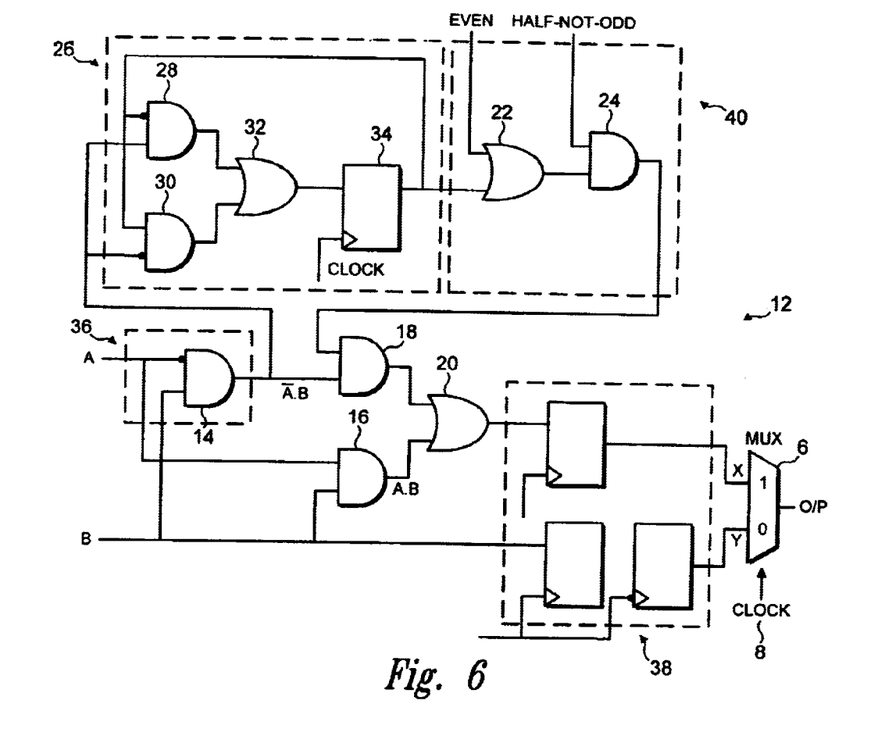
FIG. 6 shows control logic circuitry embodying the invention.
Figure 7:
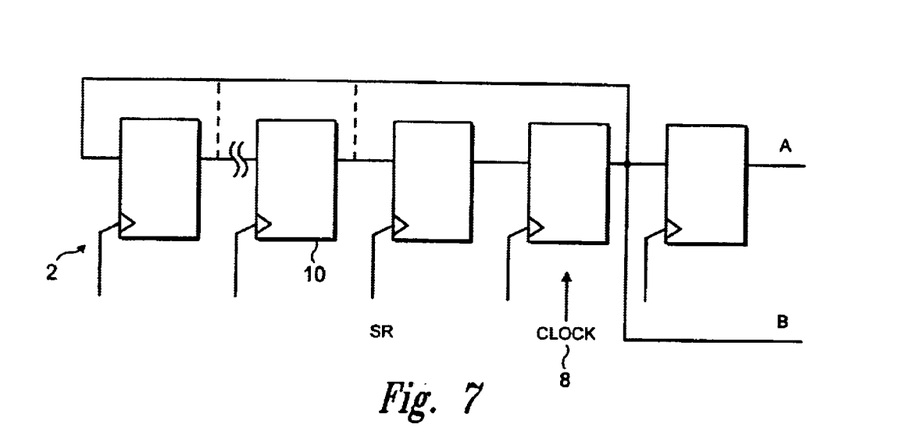
FIG. 7 shows a shift register according to the invention.

A single shift register digital divider arrangement embodying the invention and which can divide by half integers and produce a repeatable mark-space ratio is shown in FIG. 6. Like components retain the same reference numbers as before. A multiplexer 6 is clocked by a clocking signal 8 which is also provided to a shift register 2 (FIG. 7) comprising a sequence of D-type flip flops which can be set and reset by SR control signals. The register is effectively variable in length by selecting the number of D-type flip flops activated and the loop point.

Inputs A and B are thus from a single shift register as before. Input B passes direct to an input Y of the multiplexer 6 via two D-type flip flops 42, 44 of timing circuitry 38 (for timing purposes described later) whereas input A passes through additional control logic circuitry 12 which provides additional functionality to detect low to high changes in input A and to use this additional information to allow odd and half integer division.

In broad terms, the control logic circuitry 12 comprises an edge detector 36 in the form of AND gate 14 for detecting changes in the bit sequence from the shift register from 0 to 1, a toggle or latch circuit 26, program logic circuit 40, and a third D-type flip flop 46 of the timing circuitry 38 for providing an input X to the multiplexer 6. The edge detector provides a signal to the toggle circuit 26 which toggles to indicate the last status thereof. The program logic circuit 40 receives two inputs to allow the remaining gates to be configured, depending on whether odd, even or half integer division is to be performed.

The control logic circuitry 12 is arranged as follows. A first AND gate 14 with an inverted input produces an output ($\overline{A}.B$). A second AND gate 16 produces an output (A.B). With the additional knowledge that A is a historical version of B shifted by one bit, we know that:

($\overline{A}.B$)=1 if A=0 and B=1, i.e. a rising edge is detected in the shift register sequence.

Similarly, we know that:

(A.B)=1 if A=1 and B=1, i.e. the sequence is not a rising or falling edge.

This information in itself would be sufficient to perform odd integer division by configuring the circuit to always remove the first half clock cycle of sequence data from the output. This would make the mark-space ratio 4.5:4.5 rather than 5:4 that we had before. However, if this were done, then even division would have an irregular mark-space ratio. Further, division by half integers would not operate correctly. Accordingly, in addition to detecting low to high changes, the control logic circuitry determines alternate low to high changes to allow removal of the first half clock cycle of sequence data on alternate periods. This configurability is provided by a function in the circuit 12 to detect the rising edge indication and a function to select deletion of bits depending on whether the division is even, odd or half integer.

The selection of whether or not the input A is presented at the output is achieved by the third AND gate 18 under control of the program logic circuit 40. In the event that the input from the program logic circuit 40 to AND gate 18 is 1, then the output is simply the input namely ($\overline{A}.B$). In this case the input to selecting OR gate 20 is ($\overline{A}.B$) on one input and (A.B) on the other. The output of selecting OR gate 20 is therefore:

($\overline{A}.B$)+(A.B)

which is=B.

Figure 8:
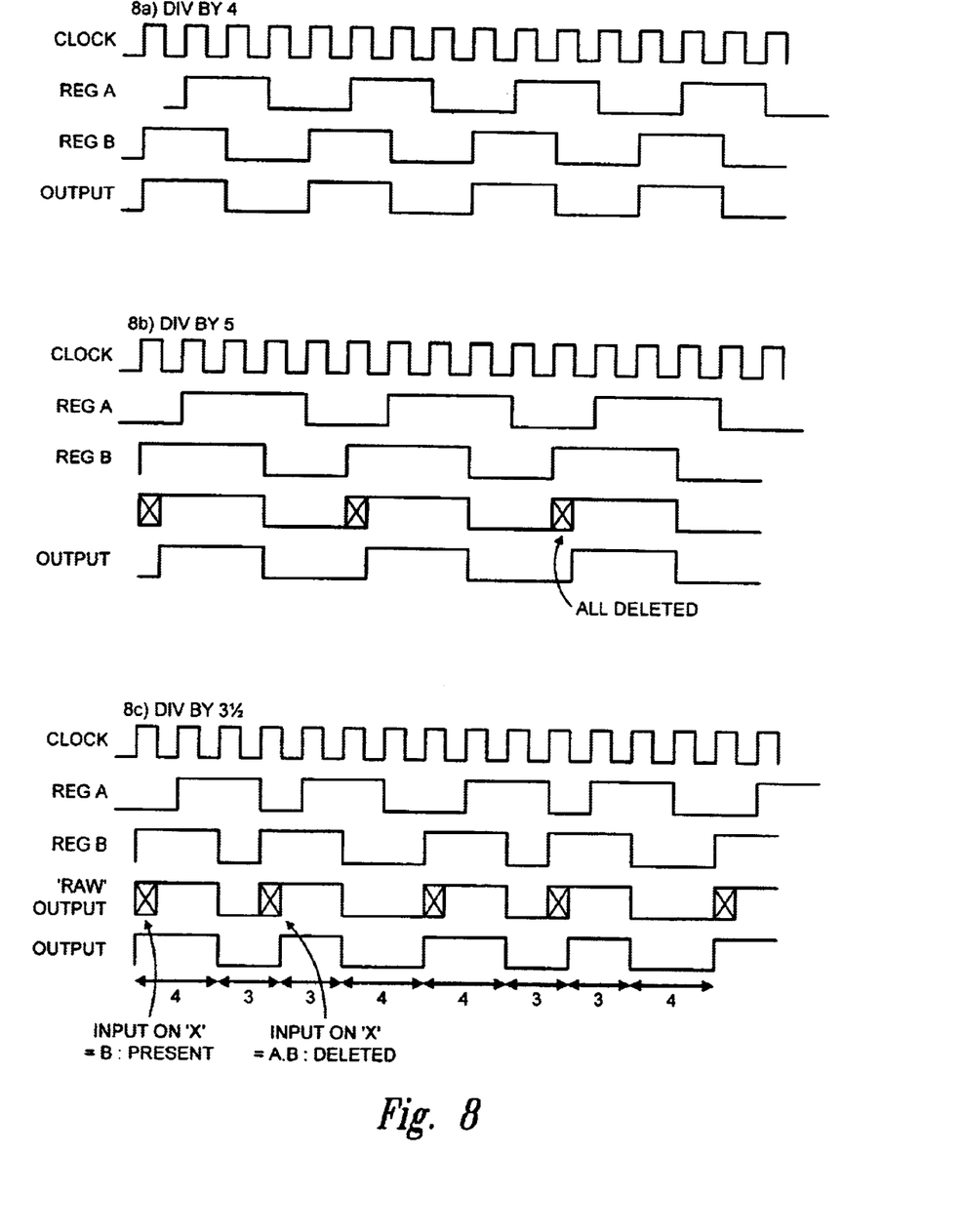
FIG. 8 shows various register sequences for the shift register and control circuitry of FIGS. 6 and 7.

The output is thus B on both channels X and Y to the multiplexer 6. The output of the multiplexer is simply B and so the pattern of digits in the shift register is simply chosen for the appropriate division e.g. (1100 1100) for divide by four as shown in FIG. 8(a). All other even divisions follow the same pattern.

The example given above for even division has the input of AND gate 18 from the program logic circuit 40 as 1 so that the output follows the input with the result that the input to the multiplexer 6 is B on both X and Y inputs. The setting of AND gate 18 to have one input as 1 (or 0) is achieved by selection functionality provided by control logic OR gate 22 and control logic AND gate 24 with respective inputs labelled "EVEN" and "HALF-NOT-ODD". These inputs are set according to the following control logic:

TABLE 1

| EVEN | HALF-NOT-ODD | FUNCTION |
|---|---|---|
| X | 0 | Divide odd whole number (e.g. divide 5) |
| 0 | 1 | Divide half ratio (e.g. divide 3.5) |
| 1 | 1 | Divide even whole number (e.g. divide 6) |

As can be seen, when dividing by an even whole number, the input to OR gate 22 is 1 and so the output is necessarily 1. The inputs to AND gate 24 are both 1 and so the output is 1 so that AND gate 18 is effectively ignored (becomes an input follower) providing the output (Ā.B)+(A.B)=B from OR gate 20 as described above.

As can also be seen, with the input of HALF-NOT-ODD as zero to AND gate 24, the output AND gate 24 is also zero, further setting the output of AND gate 18 to zero with the result that selecting OR gate 20 becomes an input follower with an output (A.B). The inputs to the multiplexer are B and (A.B) with the result as shown in FIG. 8(b) for division by 5; an even mark-space ratio is provided. Effectively, the first half clock cycle at each change from 0 to 1 is "deleted" in the sense that the input to the multiplexer is zero. This is because (A.B)=0 whenever there is a change for 0 to 1 in the bit sequence, because B=1 and A=0. The pattern in the shift register is (11100) and all other odd divisions follow the same patterning (1111000) for division by 7.

The case for division by half ratios involves toggle circuitry 26 as can now be seen. With control logic inputs EVEN=0 and HALF-NOT-ODD=1, both OR gate 22 and AND gate 24 become input followers so that the output of toggle circuit 26 is presented to AND gate 18. Following this through, the output of AND gate 18 is either 0 or (Ā.B) with the result that one of two possible outputs from OR gate 20 are given:

A.B (if D-type flip flop 34 output=0)

(Ā.B)+(A. B)=B (if D-type flip flop 34 output=1)

The output given depends on the status of the D-type flip flop circuitry 34 as now will be described.

The toggle circuitry 26 comprises two AND gates 28, 30, each with an inverting input; an OR gate 32; and a D-type flip-flop 34. The toggle itself receives a single input: (Ā.B). The D-type 34 feeds its output back to the AND gates 28, 30. When the input Ā.B=0, the input to the D-type 34 is necessarily 0 when the previous output of the D-type is 0. When the output of the D-type is zero, but the input Ā.B=1, then AND gate 28 produces output=1 so the input to the D-type=1. Thus, a change in sequence from Ā.B=0 to Ā.B=1 is sampled and produces a D-type flip flop 34 output=1. Thus, when the sequence of bits in the register changes from 0 to 1, the input to the multiplexer 6 on X is B, otherwise, the input is (A.B). The D-type flip flop 34 toggles every time a change in the sequence from 0 to 1 is detected so that the output is alternately 0 and 1 at changes in the bit sequence, and the input to the multiplexer 6 on X is alternately (A.B) and B. As a result, as shown in FIG. 8(c), alternate portions of the first half cycle of the output shown as "X" are effectively "deleted" in the sense that without toggle operation, the output would simply be B and the output would be 1.

The mark-space ratio for half division is not exactly equal (as shown) with a ratio of 3:4, but over two cycles is "even" in the sense that the output is high for as long as it is low. As previously noted, this can be important for power considerations.

Figure 9:
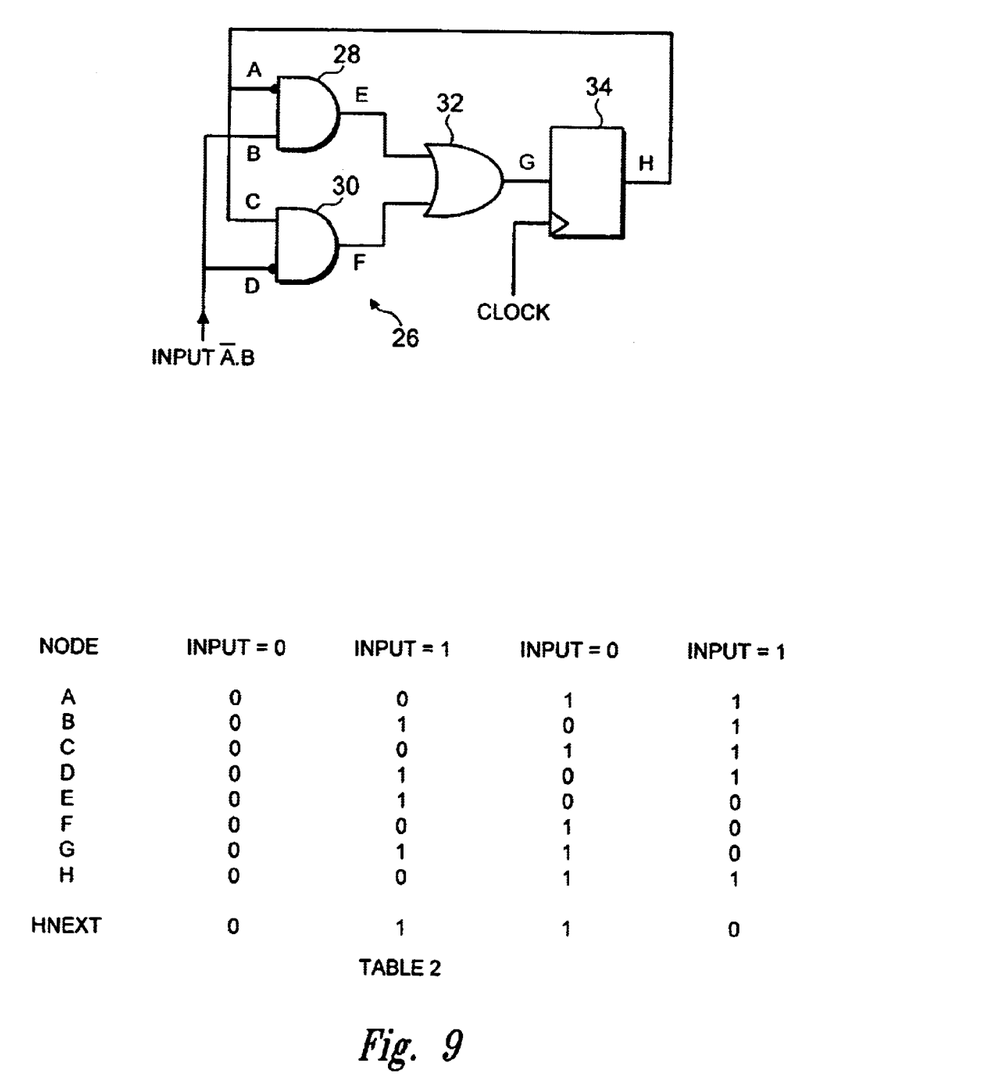
FIG. 9 shows toggle circuitry and its table of status.

The toggling operation can be understood more fully by referring to FIG. 9. The high/low status at points A to H are labelled and noted at Table 2. The reference HNEXT is the status at H after the next clock cycle. As can be seen, the output H goes to 1 when the input is 1, and stays at 1 until the input is next 1 when it goes to zero. Effectively, the whole circuit toggles from 1 to 0 and 0 to 1 alternately when the input is 1. Now since the input is (Ā.B) which, as previously described, is only high when a change in the bit register sequence from 0 to 1 is detected, the D-type flip flop circuit toggles from 0 to 1 and 1 to 0 when changes in the bit sequence from 0 to 1 are detected. As a result, alternate "edges" in the output are effectively "deleted" as previously shown and described in relation to FIG. 8(c).

In summary, the digital divider includes elements which perform the following logical functions:

a change in the register bit sequence from 0 to 1 is detected (known as an "edge");

edges selected; and edges for first half clock cycle "deleted" in the sense that the output to the multiplexer is 0.

The functions are provided (referring again to FIG. 6) by the AND gate 14 functioning as an edge detector, D-type flip flop circuitry 26 functioning as an alternate edge selector, control logic to allow the circuit to be programmed according to the appropriate division and a "deleter" to make the output 0 at selected edges.

The timing circuitry 38 comprises 3 D-type flip flops arranged with one in the X channel and one in the Y channel. This is to compensate the timing which is delayed by the D-type flip flop 34 and other components.

Clearly, other arrangements of gates and other components such as Boolean equivalents of those described may be used and are within the scope of the invention. In particular, the symbols 0 and 1 could simply be reversed throughout by use of inverters.

The application claims priority from EP application 01302299.1, filed on Mar. 13, 2002, which is incorporated herein by reference in its entirety.

From the foregoing it will be appreciated that, although specific embodiments of the invention have been described herein for purposes of illustration, various modifications may be made without deviating from the spirit and scope of the invention. Accordingly, the invention is not limited except as by the appended claims.

I claim:

1. A digital frequency divider for dividing a clock frequency comprising:

a shift register for storing a bit sequence chosen according to a division factor and having one or more tap off points and arranged to provide at least two signals representative of the bit sequence under control of a clock signal at a first frequency;

control logic circuitry having at least two inputs arranged to receive the two signals representative of the bit sequence and arranged to provide at least two output signals; and a multiplexer arranged to receive the two output signals and to select one of the output signals in turn under control of the clock signal at the first frequency to thereby produce a clock output signal at a second frequency being a division of the first frequency;

wherein the control logic circuitry comprises a detector configured to detect a change in the bit sequence between 0 and 1 and the control logic circuitry being arranged to selectively provide a 0 or 1 as one of the output signals when a change in the bit sequence between 0 to 1 is detected depending on whether even, odd or half integer division is performed.

2. A digital frequency divider according to claim 1, wherein the multiplexer is arranged to select a first one of the output signals when the clock signal is high and a second one of the output signals when the clock signal is low.

3. A digital frequency divider according to claim 1, wherein the shift register is variable length to allow bit sequences for division by different factors.

4. A digital frequency divider according to claim 1, wherein the shift register is a circulating shift register.

5. A digital frequency divider according to claim 1, wherein the shift register has two tap off points and the tap off points are adjacent such that a first one of the two input signals is equal to a second one of the two input signals delayed by one clock period.

6. A digital frequency divider according to claim 5, wherein the detector comprises an AND gate arranged to receive the first input signal inverted and the second input signal to thereby produce an output 1 when a change in the bit sequence between 0 and 1 is detected, and an output 0 otherwise.

7. A digital frequency divider according claim 1, wherein the control logic circuitry is arranged to produce 1 as a first one of the outputs when a change in the bit sequence is detected for even division.

8. A digital frequency divider according to claim 1, wherein the control logic circuitry is arranged to produce a 0 as a first one of the outputs when a change in the bit sequence is detected for odd division.

9. A digital frequency divider according to claim 1, wherein the control logic circuitry is arranged to alternately produce a 0 then 1 as a first one of the outputs when a change in the bit sequence is detected for half integer division.

10. A digital frequency divider according to claim 1, wherein the control logic circuitry includes program circuitry for indicating one of three states respectively for even, odd or half integer division.

11. A digital frequency divider according to claim 10, wherein the program circuitry provides a 1 for even division, 0 for odd division or alternately 1 and 0 for half integer division.

12. A digital frequency divider according to claim 10, wherein the program circuitry comprises an OR gate and AND gate in sequence each with one control input.

13. A digital frequency divider according to claims 10, wherein the control logic circuitry includes a toggle arranged to receive a signal from the detector and to alternately produce 0 or 1 on receiving an indication of a change in the bit sequence, and to provide the alternate 0 or 1 to the control logic circuitry.

14. A digital frequency divider for dividing a clock frequency comprising:

control logic circuitry under control of a clock signal at a first frequency and having a first input arranged to receive a first signal representative of a first bit sequence, a second input arranged to receive a second signal representative of a second bit sequence, and first and second outputs arranged to provide first and second output signals, respectively; and a multiplexer having first and second inputs coupled to the first and second outputs of the control logic circuitry, the multiplexer being structured to select one of the output signals in turn under control of the clock signal at the first frequency to thereby produce a clock output signal at a second frequency being a division of the first frequency;

wherein the control logic circuitry comprises a detector configured to detect a change in one of the bit sequences between first and second logic states and the control logic circuitry is arranged to selectively provide a 0 or 1 as one of the output signals when a change in the bit sequence between the first and second logic states is detected depending on whether even, odd or half integer division is performed.

15. A method of dividing a clock frequency, comprising:

providing first and second input signals representative of a bit sequence under control of a clock signal at a first frequency, wherein the bit sequence is chosen according to a division factor;

detecting a change in the bit sequence from a first logic state to a second logic state;

providing first and second control signals based on the input signals, wherein one of the control signals is selectively provided as a 0 or 1 when a change in the bit sequence between the first and second logic states is detected depending on whether even, odd or half integer division is performed; and producing a clock output signal at a second frequency that is a division of the first frequency by alternately selecting one of the control signals under control of the clock signal at the first frequency.

* * * * *